United States Patent
Yokoo et al.

(10) Patent No.: US 8,322,509 B2
(45) Date of Patent: Dec. 4, 2012

(54) SOLAR CELL MODULE CONVEYER LINE

(75) Inventors: Masayoshi Yokoo, Yamagata (JP);
Koichi Yoshida, Yamagata (JP);
Norikazu Kainuma, Yamagata (JP);
Akio Murakami, Yamagata (JP)

(73) Assignee: Tohoku Seiki Industries, Ltd.,
Yamagata-shi, Yamagata (JP)

( * ) Notice: Subject to any disclaimer, the term of this patent is extended or adjusted under 35 U.S.C. 154(b) by 222 days.

(21) Appl. No.: 12/676,845

(22) PCT Filed: Sep. 7, 2007

(86) PCT No.: PCT/JP2007/067900
§ 371 (c)(1),
(2), (4) Date: Mar. 5, 2010

(87) PCT Pub. No.: WO2009/031249
PCT Pub. Date: Mar. 12, 2009

(65) Prior Publication Data
US 2010/0300834 A1    Dec. 2, 2010

(51) Int. Cl.
*B23Q 41/02*   (2006.01)
*B65G 17/46*   (2006.01)
*B65G 23/26*   (2006.01)
*B65G 23/28*   (2006.01)
*B65G 47/52*   (2006.01)
*H01L 31/04*   (2006.01)

(52) U.S. Cl. ............... 198/339.1; 198/472.1; 198/690.1; 198/813; 198/817

(58) Field of Classification Search ............... 198/339.1, 198/468.5, 472.1, 690.1, 867.04, 803.6, 813–816, 198/817, 832.1, 850–851
See application file for complete search history.

(56) References Cited

U.S. PATENT DOCUMENTS

| | | | |
|---|---|---|---|
| 4,586,601 A * | 5/1986 | Hodlewsky | 198/690.1 |
| 6,325,927 B1 * | 12/2001 | Green | 210/222 |
| 7,721,873 B2 * | 5/2010 | Gauss et al. | 198/690.1 |
| 7,754,962 B2 | 7/2010 | Okamoto et al. | |
| 7,954,449 B2 * | 6/2011 | Duff et al. | 118/314 |
| 7,975,362 B2 * | 7/2011 | Gysi et al. | 29/564.1 |
| 2005/0011733 A1 * | 1/2005 | Imai et al. | 198/690.1 |
| 2005/0217718 A1 | 10/2005 | Dings et al. | |
| 2006/0278497 A1 * | 12/2006 | White et al. | 198/339.1 |
| 2009/0256581 A1 * | 10/2009 | Lu et al. | 324/715 |
| 2011/0127139 A1 * | 6/2011 | Huang | 198/339.1 |

FOREIGN PATENT DOCUMENTS

| | | |
|---|---|---|
| CN | 1663054 | 8/2005 |
| CN | 1917236 | 2/2007 |
| CN | 101808776 | 7/2012 |

(Continued)

OTHER PUBLICATIONS

European Search Report for EP 07 807 307.9 mailed Jul. 25, 2012.
(Continued)

*Primary Examiner* — Mark A Deuble
(74) *Attorney, Agent, or Firm* — Merchant & Gould P.C.

(57) ABSTRACT

A solar cell module conveyer comprising an assembly line for intermittently feeding solar cells that constitute a solar cell module, and having machinery arranged for successively executing the working/treating steps; belt conveyers working as an inspection line which is synchronized with the assembly line to inspect the solar cell module fabricated on the assembly line through various working/treatment steps; and a transfer mechanism for transferring the solar cell module from the assembly line onto the belt conveyers.

9 Claims, 14 Drawing Sheets

FOREIGN PATENT DOCUMENTS

| | | | |
|---|---|---|---|
| DE | 32 38 187 | 4/1984 | |
| JP | 48-10777 | 2/1973 | |
| JP | 62093120 A * | 4/1987 | ................. 198/690.1 |
| JP | 63-110412 | 7/1988 | |
| JP | 63-288808 | 11/1988 | |
| JP | 3-216409 | 9/1991 | |
| JP | 8-295233 | 11/1996 | |
| JP | 9-124125 | 5/1997 | |
| JP | 9-509013 | 9/1997 | |
| JP | 10-324411 | 12/1998 | |
| JP | 11-292231 | 10/1999 | |
| JP | 2001-223382 | 8/2001 | |
| JP | 2002-231983 | 8/2002 | |
| JP | 2003-037279 | 2/2003 | |
| JP | 2004-288677 | 10/2004 | |
| JP | 2004-335903 | 11/2004 | |
| JP | 2005-235920 | 9/2005 | |
| JP | 2007-221891 | 8/2007 | |
| WO | WO 2006/043658 | 4/2006 | |

OTHER PUBLICATIONS

Japanese Office Action for JP 2009-531087 mailed Aug. 28, 2012.

\* cited by examiner

SOLAR CELL MODULE CONVEYER LINE

This application is a National Stage Application of PCT/JP2007/067900, filed 7 Sep. 2007 and which application is incorporated herein by reference. To the extent appropriate, a claim of priority is made to the above disclosed application.

TECHNICAL FIELD

This invention relates to a solar cell module conveyer line which, in producing solar cell modules, intermittently positions and conveys a plurality of solar cells successively maintaining a predetermined distance enabling the products inspection and ejection.

BACKGROUND ART

In recent years, solar cells demand rises in various fields.

Due to their complex constitution, the solar cells have heretofore been manually fabricated. In order to improve the productivity, conveyer lines have now been proposed making it possible to automatically assemble the solar cells.

According, to JP-A-2001-223382, for example, a metal plate and a terminal box are automatically attached to a solar cell panel by executing a double-sided tape-sticking step in which the solar cell panel is placed on a conveyer, double-sided tape is stuck to the back surface of the solar cell panel, and a backing paper is peeled off; an adhesive-applying step of applying adhesive to the back surface of the solar cell panel; a metal plate-fixing step of fixing a metal plate to the back surface of the solar cell panel; a step of sticking double-sided tape to a portion of the metal plate on where a terminal box is to be mounted and peeling backing paper; a terminal box-fixing step of feeding a terminal box onto the metal plate to electrically connect it to the solar cell panel; and a potting material-filling step of feeding a potting material into the terminal box so as to be filled therein.

Further, a solar cell module of a wire collector system has been proposed in to which a photosensitive semiconductor film is formed on each of the solar cells that constitute the solar cell module and many collector wires are arranged thereon in parallel.

The solar cell module is constituted by solar cells which are connected together in a suitable number of pieces.

That is, the solar cell module is produced through the steps of feeding the solar cells, connecting the solar cells together, connecting diodes thereto, sealing the front and back surfaces, checking the electric conduction and inspection.

An SUS plate of a predetermined size is used for the cells from which the solar cell module is constituted through the above-mentioned steps, so that when a plurality of solar cells are connected together, a predetermined gap (e.g., 1 to 1.2 mm) is maintained among the cells.

The assembly line employs conveyers constituted by attaching magnets to steel belts, and the solar cells are conveyed attracted by the magnets. The solar cells are intermittently fed while maintaining a gap for one piece of cell.

This is because a short circuit may occur if the gap decreases among the solar cells. However, if the gap is too great, the electric resistance increases among the solar cells. In addition, when a plurality of solar cells are connected together and assembled, the overall length may exceed a predetermined length, resulting in a defective product.

After assembly, the solar cell module is transferred from the conveyer to which the magnets are stuck to another conveyer so as to be fed to a next step (step of inspection, etc.). At this process, too, the solar cells must maintain the predetermined gap among themselves.

However, the following problems occur on the conveyer line that passes through the above-mentioned steps.
(1) The conveyer belts with magnets are obtained by sticking magnets to steel belts. As the steel belts stretch or bend at the pulley portions, the magnets crack, by a decrease of the durability, they peel off from the steel belts and their attractive forces decrease.
(2) To replace the magnets, the entire conveyer belt must be replaced requiring laborious work. Therefore, the production line is forced to stop during the replacement.
(3) The conveyer belts with magnets, which are steel belts, develop a very small degree of slipping relative to the pulleys, making it difficult to maintain the predetermined gap among the solar cells, and often resulting in defective products.
(4) It is difficult to transfer the products from the conveyer belts with magnets to the next belt conveyer, and the products often become damaged.

The present invention was proposed in order to solve the above problems, and has an object of providing a solar cell module conveyer line which, in producing solar cell modules, intermittently positions and conveys a plurality of solar cells successively maintaining a predetermined distance enabling the products inspection and ejection.

DISCLOSURE OF THE INVENTION

According to the present invention, there is provided a solar cell module conveyer line comprising:

an assembly line for intermittently feeding solar cells that constitute a solar cell module and having machinery arranged for successively executing the working/treating steps; an inspection line which is synchronized with the assembly line to inspect the solar cell module fabricated on the assembly line through the various working/treating steps; and a transfer mechanism for transferring the solar cell module from the assembly line onto the inspection line.

According to one aspect of the invention, the assembly line is provided with conveyers with magnets, the conveyers with magnets include chain conveyers which are traveling base bodies and magnets individually and detachably attached to endless chain-constituting elements that constitute the chain conveyers.

According to one aspect of the invention, the conveyers with magnets are provided with an automatic tension-adjusting mechanism.

According to one aspect of the invention, the inspection line includes belt conveyers, while the conveyers with magnets and the belt conveyers share a drive means, and the conveyers with magnets and the belt conveyers are driven by the drive means so as to intermittently position and convey the solar cells for every predetermined distance.

According to one aspect of the invention, the transfer mechanism includes connection conveyers arranged in parallel with and between the conveyers with magnets constituting the assembly line and the belt conveyers constituting the inspection line, and a lift means under the connection conveyers to shut off the magnetic attractive forces of the conveyers with magnets for the solar cell module that is to be fed from the conveyers with magnets onto the belt conveyers.

According to one aspect of the invention, the connection conveyers are driven by the drive means shared by the conveyers with magnets and the belt conveyers.

According to one aspect of the invention, the belt conveyers constituting the inspection line have a hand-over start position which has entered more into the side of the assembly line than a hand-over end position of the conveyers with magnets that constitute the assembly line, and the connection conveyers are arranged from the hand-over start position of the belt conveyers constituting the inspection line up to the hand-over end position which has entered more into the inspection line than the hand-over end position of the conveyers with magnets.

According to one aspect of the invention, the belt conveyers constituting the inspection line include a dedicated drive means in addition to the shared drive means, and the belt conveyers are driven by switching the shared drive means and the dedicated drive means in order to convey the solar cell module.

According to one aspect of the invention, the conveyers with magnets are driven by transmitting the driving force to a timing pulley and a chain sprocket fixed to a drive shaft that is rotatably supported through a timing pulley fixed to a motor shaft in the drive means shared by the conveyers with magnets and the belt conveyers and through a timing belt, and only when the clutch is coupled, the connection conveyers and the belt conveyers are driven by transmitting the driving force of the shared drive means to the timing belt spanning from the hand-over start position of the connection conveyers and of the belt conveyers to the hand-over end position of the connection conveyers and to the timing pulley through a timing pulley fixed to the clutch provided on the motor shaft.

According to one aspect of the invention, the lift means has belt guide rollers that come in contact with the belt conveyers and the connection conveyers from the back surface sides thereof, and direct-acting drive means for driving the belt guide rollers up and down.

An embodiment of the invention will now be described with reference to the accompanying drawings.

BEST MODE FOR CARRYING OUT THE INVENTION

Figure 1:
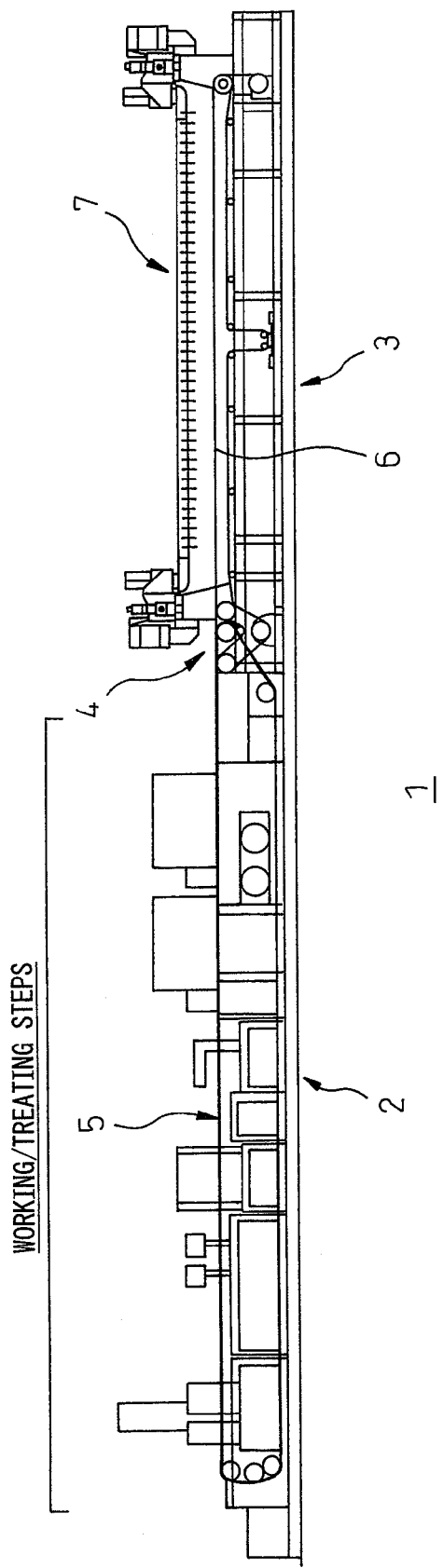
FIG. 1 is a view illustrating the entire constitution of a solar cell module conveyer line according to the invention.
Figure 2:
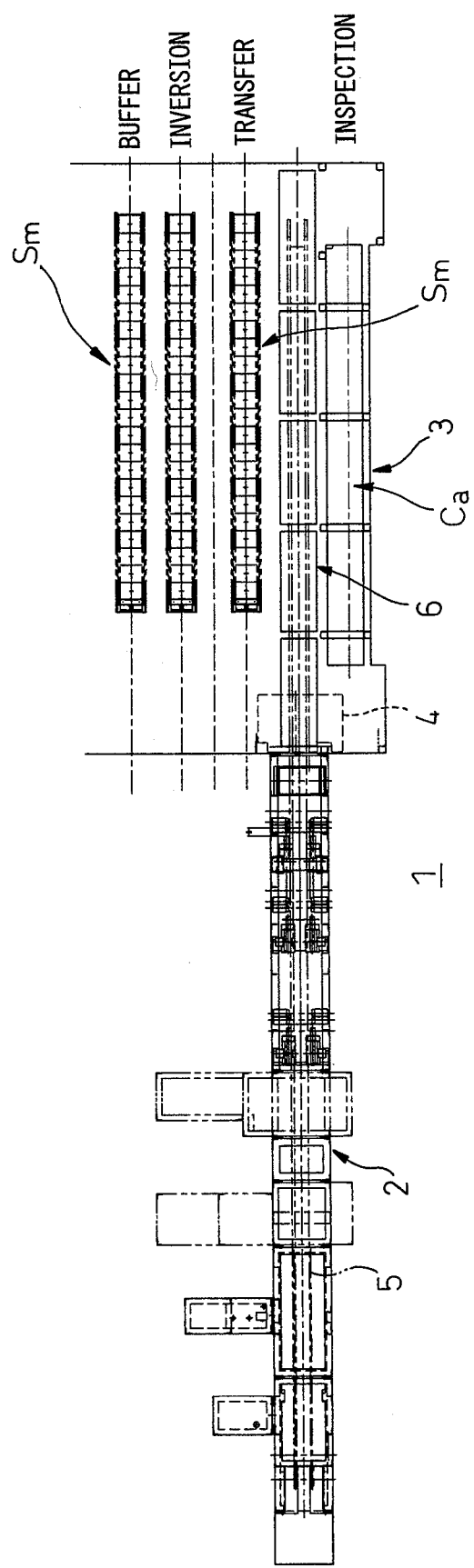
FIG. 2 is a complete plan view of the solar cell module conveyer line in FIG. 1.

FIGS. 1 and 2 illustrate a solar cell module conveyer line 1 according to the present invention.

The solar cell module conveyer line 1 is provided with belt conveyers (described later) that serve as an assembly line 2 for intermittently feeding solar cells (described later) that constitute a solar cell module (described later), and having machinery arranged for successively executing the working/treating steps, and that also serve as an inspection line 3 which is operated in synchronism with conveyers (described later) in the assembly line 2 to inspect the solar cell module fabricated on the conveyers (described later) in the assembly line 2 through various workings and treatments, and, further, includes a transfer mechanism 4 for transferring the solar cell module from the conveyers in the assembly line 2 onto the inspection line 3.

The assembly line 2 is provided with conveyers 5 with magnets. The conveyers 5 with magnets are driven by a drive means that will be described later to intermittently feed the solar cells (described later) that constitute the solar cell module (described later) which is to be assembled. Namely, the solar cell module Sm is assembled through the working/treating steps by using machinery arranged along the conveyers 5 with magnets. Briefly describing, the working/treating steps are for feeding solar cells, connecting the solar cells together, connecting the diodes, sealing the front and back surfaces, and checking the electric conduction.

The working/treating steps can be suitably set depending upon the constitution of the assembled solar cell module Sm, as a matter of course.

After the working/treating steps, the solar cell module is attracted and transferred, inverted, inspected and contained in a buffer on the belt conveyers which serve as the inspection line 3.

The inspection line 3 uses known belt conveyers 6.

On the belt conveyers 6, further, attractive conveyer devices 7 are arranged to attract and transfer the solar cell module Sm brought from the conveyers in the assembly line 2 onto the belt conveyers 6, to invert it, to check it (check for its electromotive force), and to contain it in a buffer.

Further, an inspection space Ca is provided by the side of the belt conveyers 6 to execute the inspection. The inspection includes checking the solar cell module Sm for its electromotive force and checking the appearance.

The solar cell module Sm that is to be assembled will be briefly described. The solar cell is, for example, an amorphous silicon solar cell and uses, for example, an SUS plate as a substrate for constituting each solar cell Sc.

Figure 3:
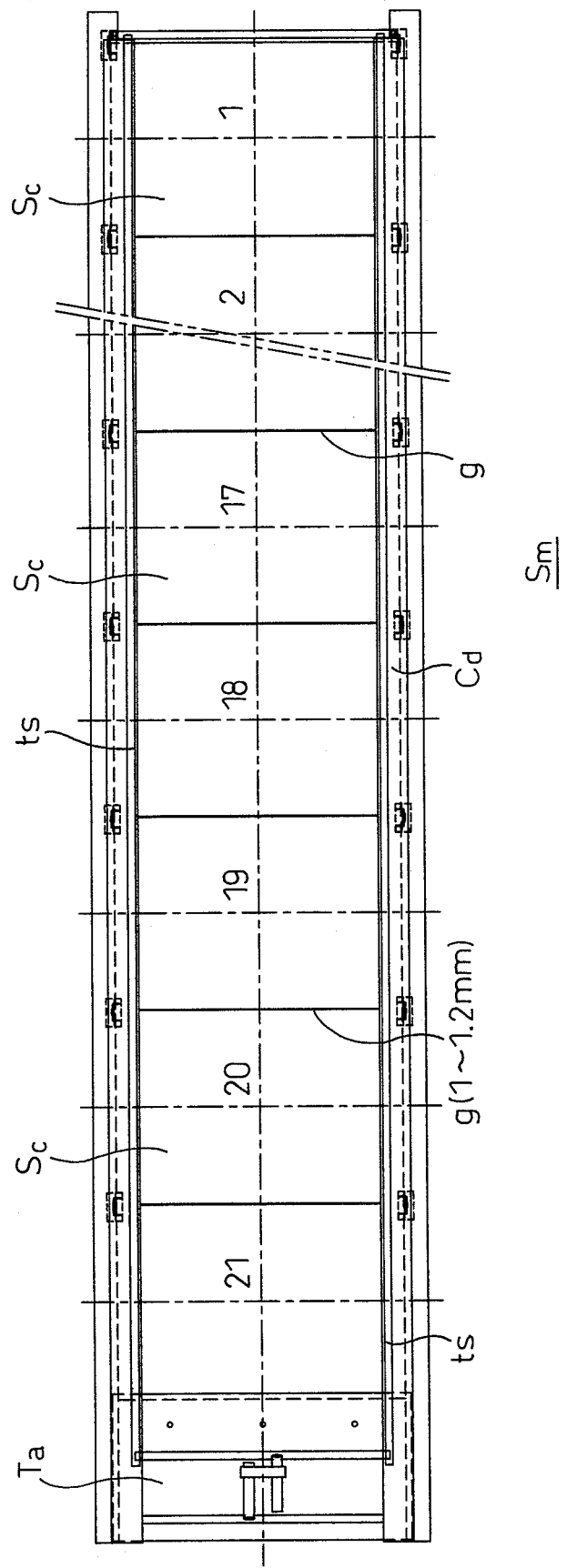
FIG. 3 is a view illustrating the constitution of a solar cell module that is to be fabricated through the solar cell module conveyer line in FIG. 1.

That is, as shown in FIG. 3, the solar cell module Sm is constituted by a predetermined number of the solar cells, and a terminal assembly Ta which collects, through the side copper tabs ts, the electric power produced by each of the solar cells Sc and sends the electric power to an external receiving facility (not shown).

A gap g is provided among the substrates of the solar cells Sc, the gap g being specified as 1 to 1.2 mm so that the solar cells Sc will not short-circuit each other and that the gap g will not become too great to increase the electric resistance.

Further, diodes D are arranged among the solar cells Sc so that the electric power produced by the solar cells Sc will not reversely flow. The diodes D are connected among the solar cells Sc in the forward direction facing the terminal assembly Ta, and have their surfaces covered with a protective diode cushion member Cd. The number of solar cells Sc for constituting the solar cell module Sm will be several pieces-dozens of pieces.

Figure 4:
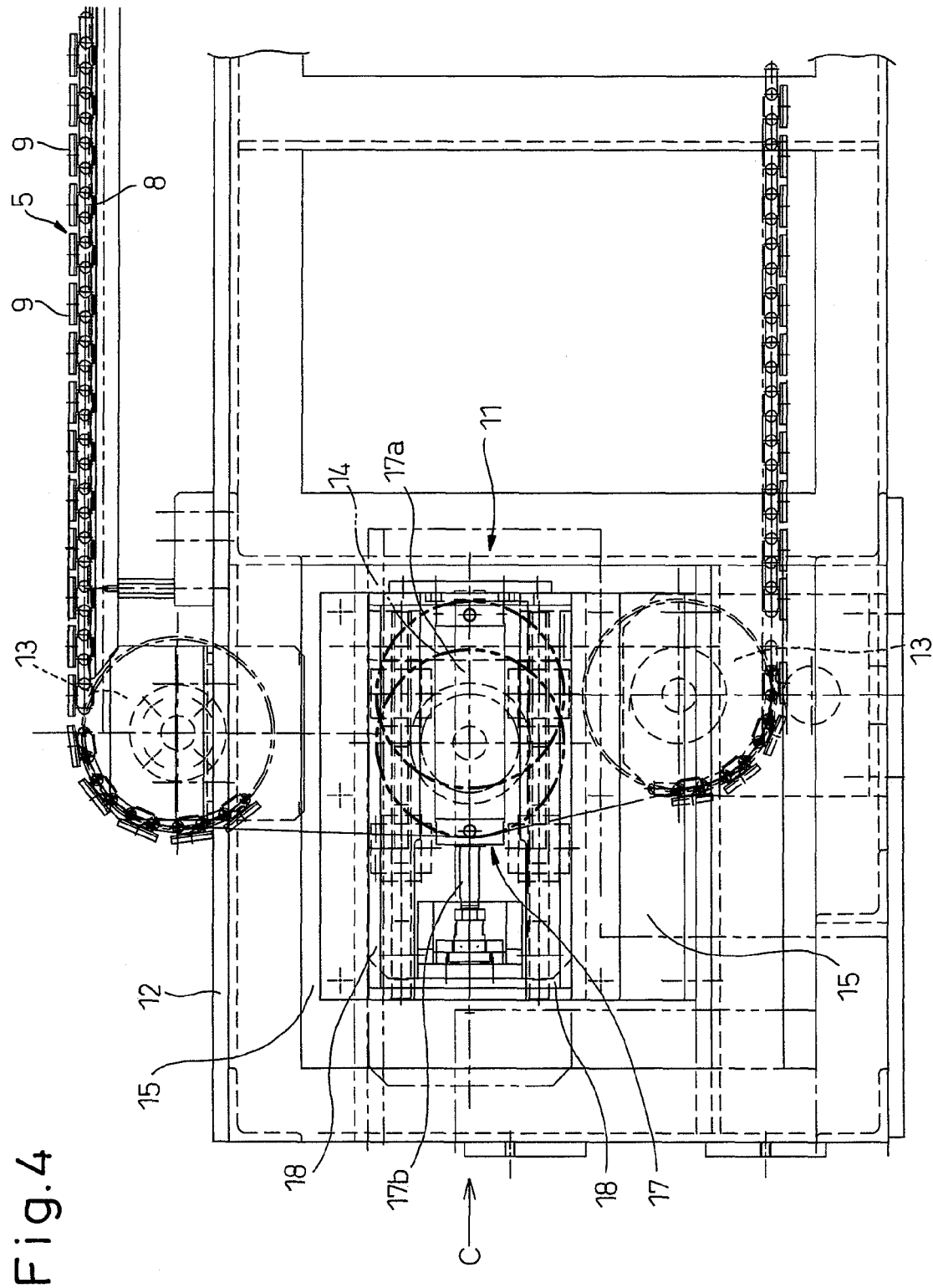
FIG. 4 is a view illustrating the constitution of an automatic tension-adjusting mechanism for conveyers with magnets in the assembly line.

Referring to FIG. 4, the conveyers 5 with magnets in the assembly line 2 comprise chain conveyers 8 which are endless chain tracks, and magnets 9 detachably attached to each of the endless chain-constituting elements of the chain conveyers 8.

Figure 5:
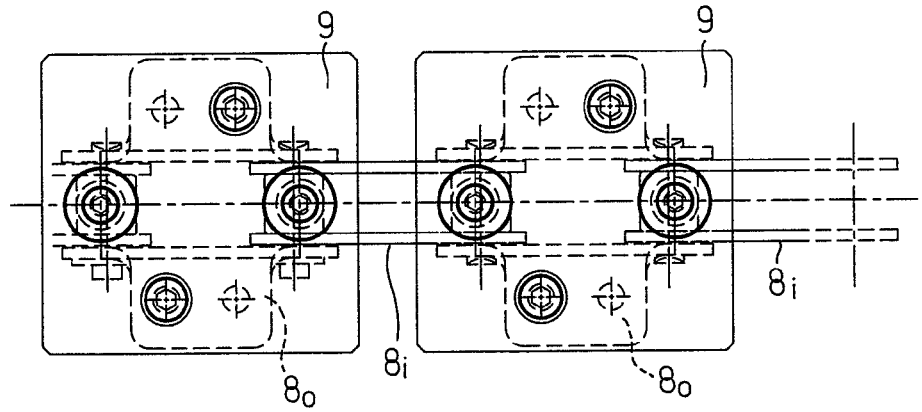
FIG. 5 is a plan view showing constituent elements of the conveyers with magnets.
Figure 6:
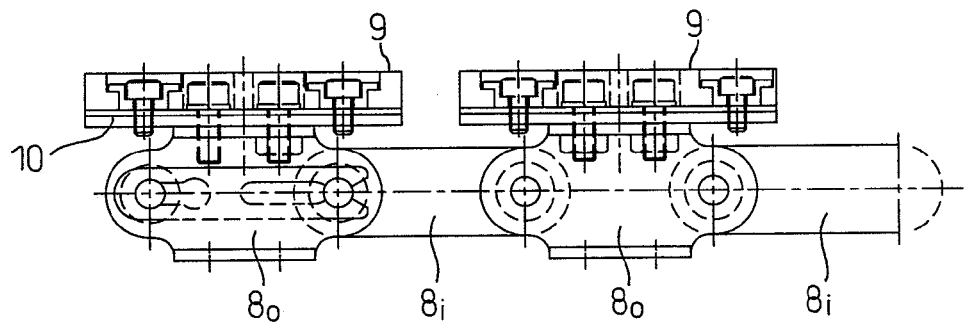
FIG. 6 is a perspective side view of the constituent elements of the conveyers with magnets shown in FIG. 5.
Figure 7:
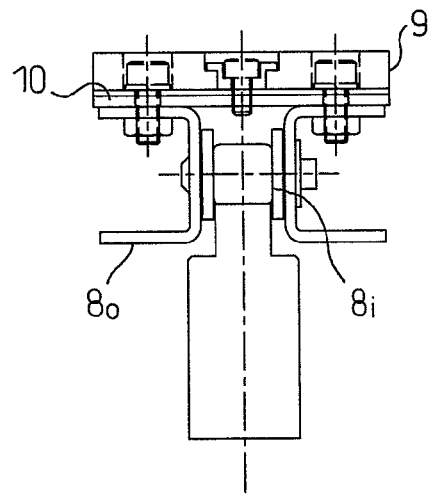
FIG. 7 is a perspective front view of the constituent element of the conveyers with magnets shown in FIG. 5.

The top surface of the magnet 9 is nearly of a square shape, and the magnet 9 is detachably attached, by using bolt and nut and via a plate 10, to an outer link 8o of nearly a U-shape in cross section which constitutes, together with an inner link 8i, the endless chain-constituting element of the chain conveyer 8 (see FIGS. 5, 6 and 7).

The magnet 9 is obtained by kneading, for example, a widely known ferrite magnet powder and a synthetic rubber or a polymer resin for imparting elasticity and, therefore, has flexibility and elasticity.

The conveyers 5 with magnets are running maintaining a predetermined tension between an automatic tension-adjusting mechanism 11 arranged near a position where a first step is executed among the working/treating steps and a shared drive means (described later) for the conveyers 5 with magnets and for the belt conveyers in the inspection line 3, that is arranged near a transfer mechanism 4 for transferring the solar cell module Sm from the assembly line 2 onto the inspection line 3.

The automatic tension-adjusting mechanism 11 will be described.

Figure 8:
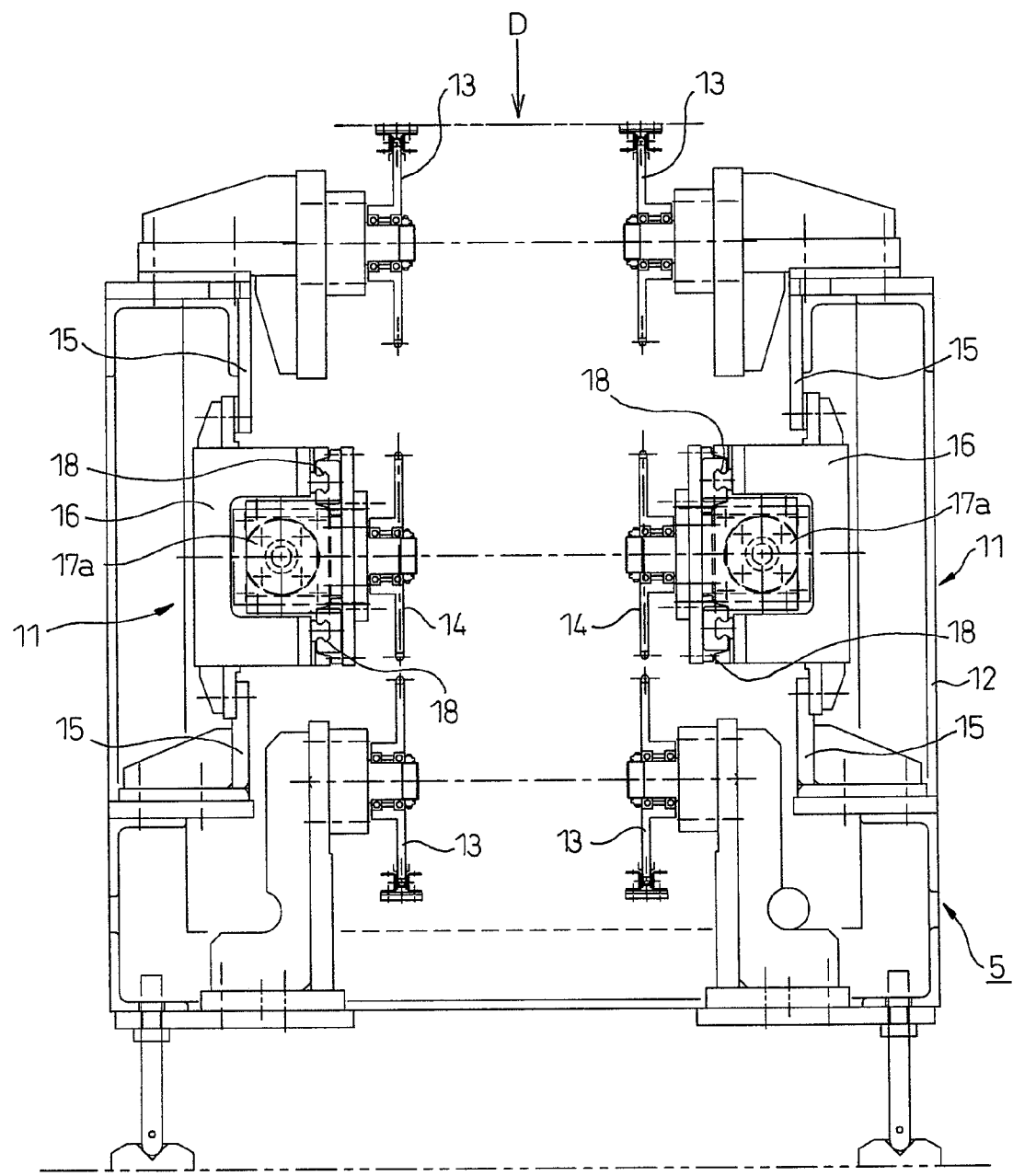
FIG. 8 is a view illustrating the constitution of the automatic tension-adjusting mechanism for the conveyers with magnets in the assembly line shown in FIG. 4 as viewed from the C-direction.

Referring to FIGS. 4 and 8, the automatic tension-adjusting mechanism 11 includes tension-imparting sprockets 14 between upper and lower idle sprockets 13 about which the conveyers 5 with magnets run near one end of a linear conveyer frame 12 which constitutes the conveyers 5 with magnets along the machinery for executing the working/treating steps.

Figure 9:
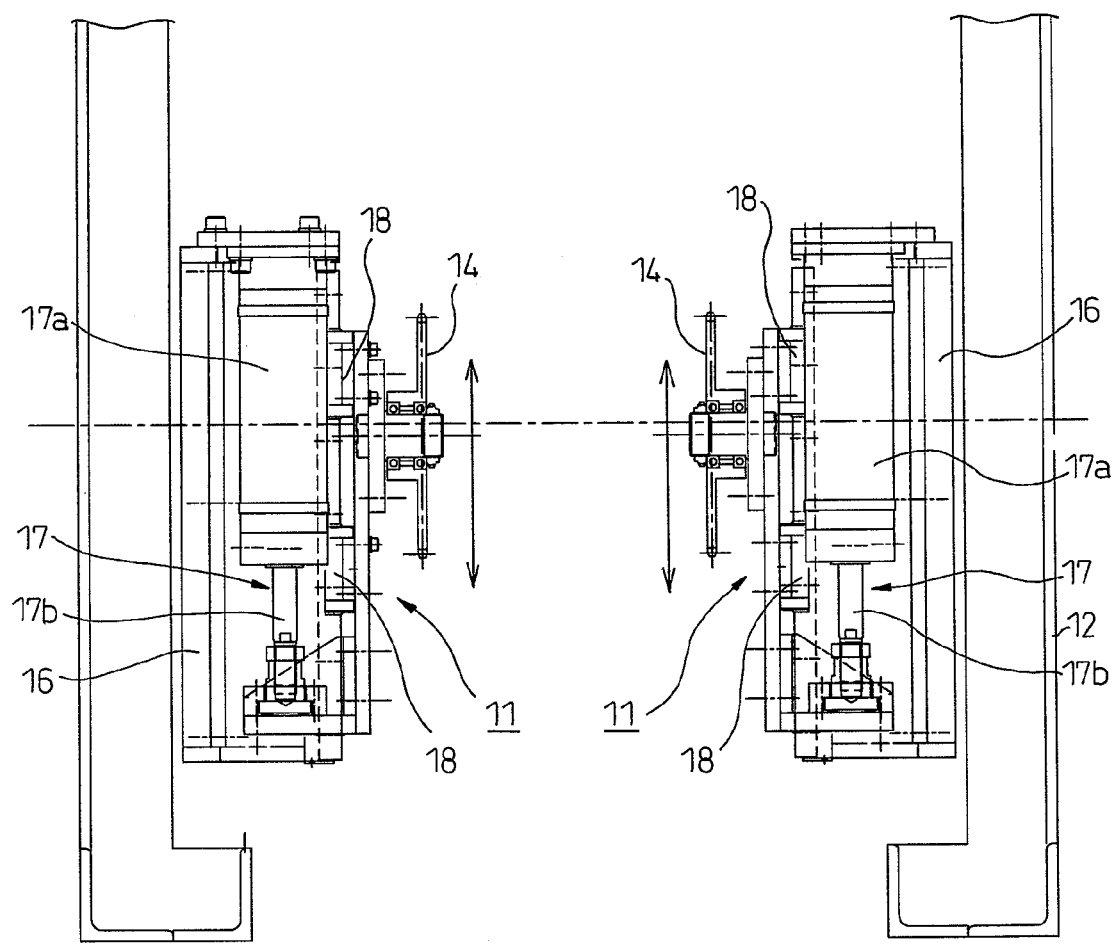
FIG. 9 is a view illustrating the constitution of the automatic tension-adjusting mechanism shown in FIG. 8 as viewed from the D-direction.

Referring to FIG. 9, air is suitably fed to direct-acting air cylinders 17 mounted on direct-acting guide members 16 attached to an inner frame 15 of the conveyer frame 12 between the idle sprockets 13 whereby the tension-imparting sprockets 14 move back and forth together with the cylinder portions 17a of the air cylinders 17 along LM guides 18 that extend in the direction of long axis of the conveyer frame 12, i.e., toward the end of rod portions 17b of the air cylinders 17. Thus, the tension-imparting sprockets 14 are pushed onto the chain conveyers 8 of the conveyers 5 with magnets so as to be in mesh therewith to adjust the tension of the conveyers 5 with magnets.

Next, described below is the transfer mechanism 4 for transferring the solar cell module Sm from the conveyers 5 with magnets in the assembly line 2 onto the belt conveyers 6 in the inspection line 3.

Figure 10:
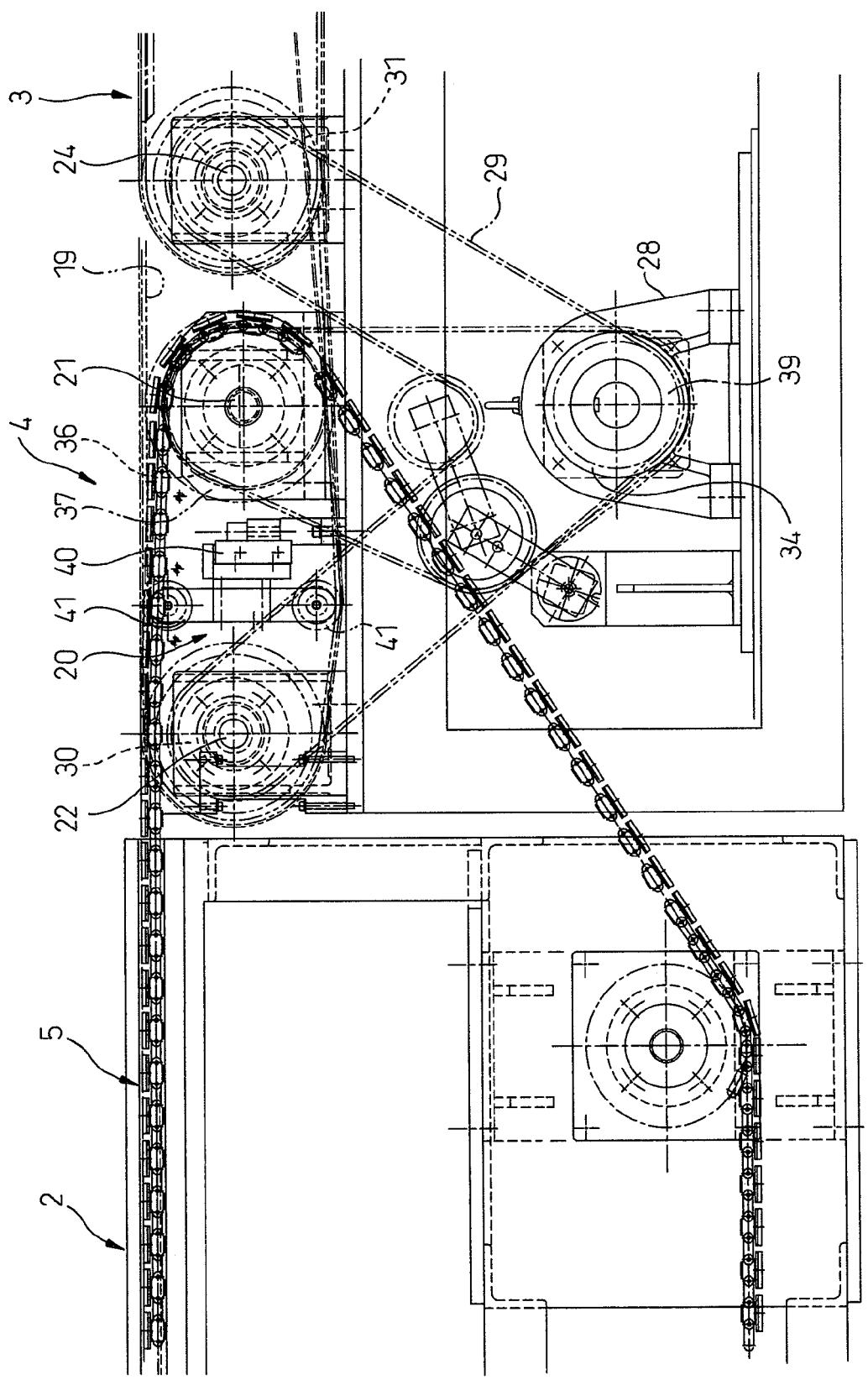
FIG. 10 is a view illustrating the constitution of a transfer mechanism from the assembly line to an inspection line and of a shared drive means.
Figure 11:
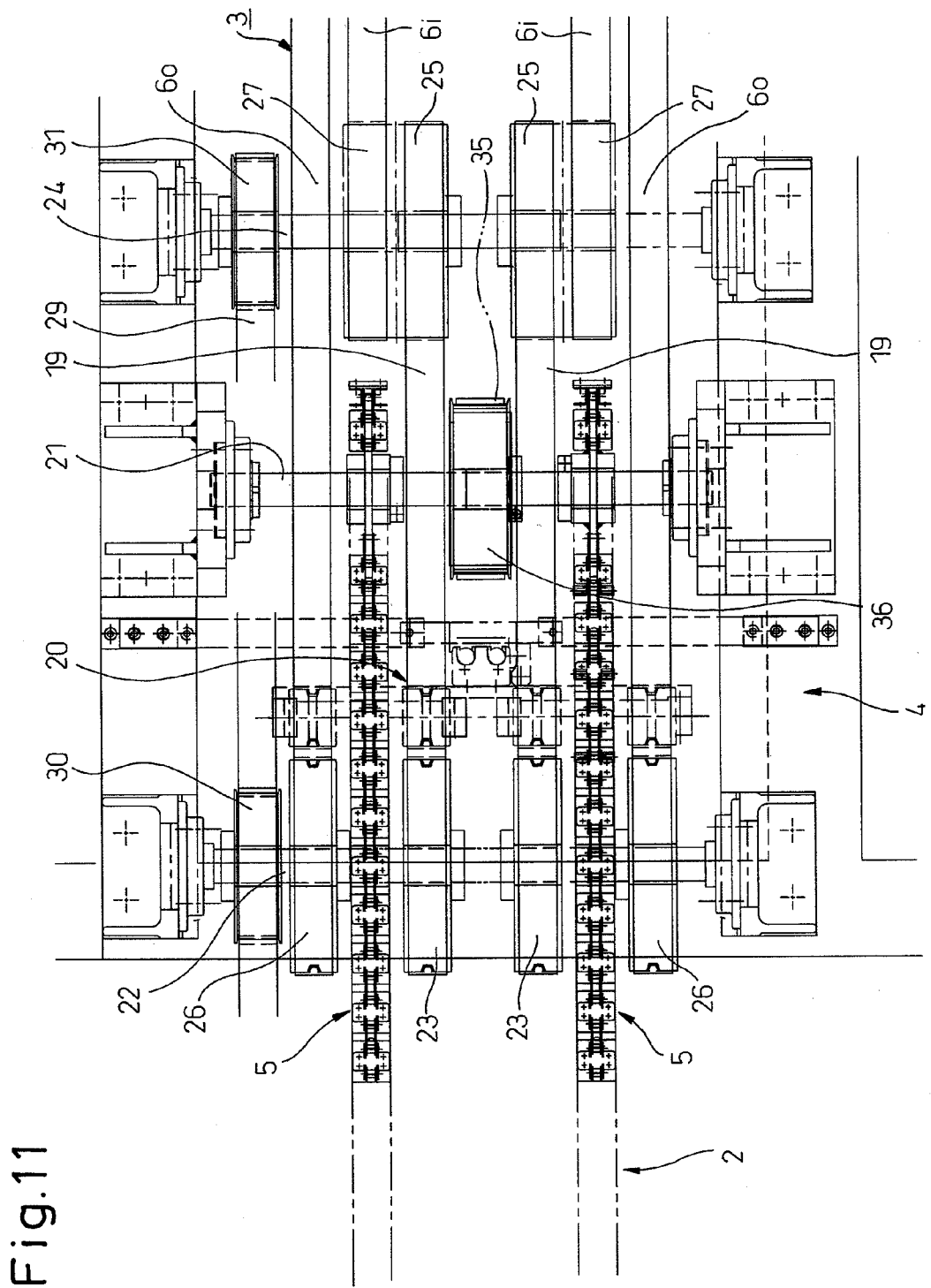
FIG. 11 is a plan view of the transfer mechanism.
Figure 12:
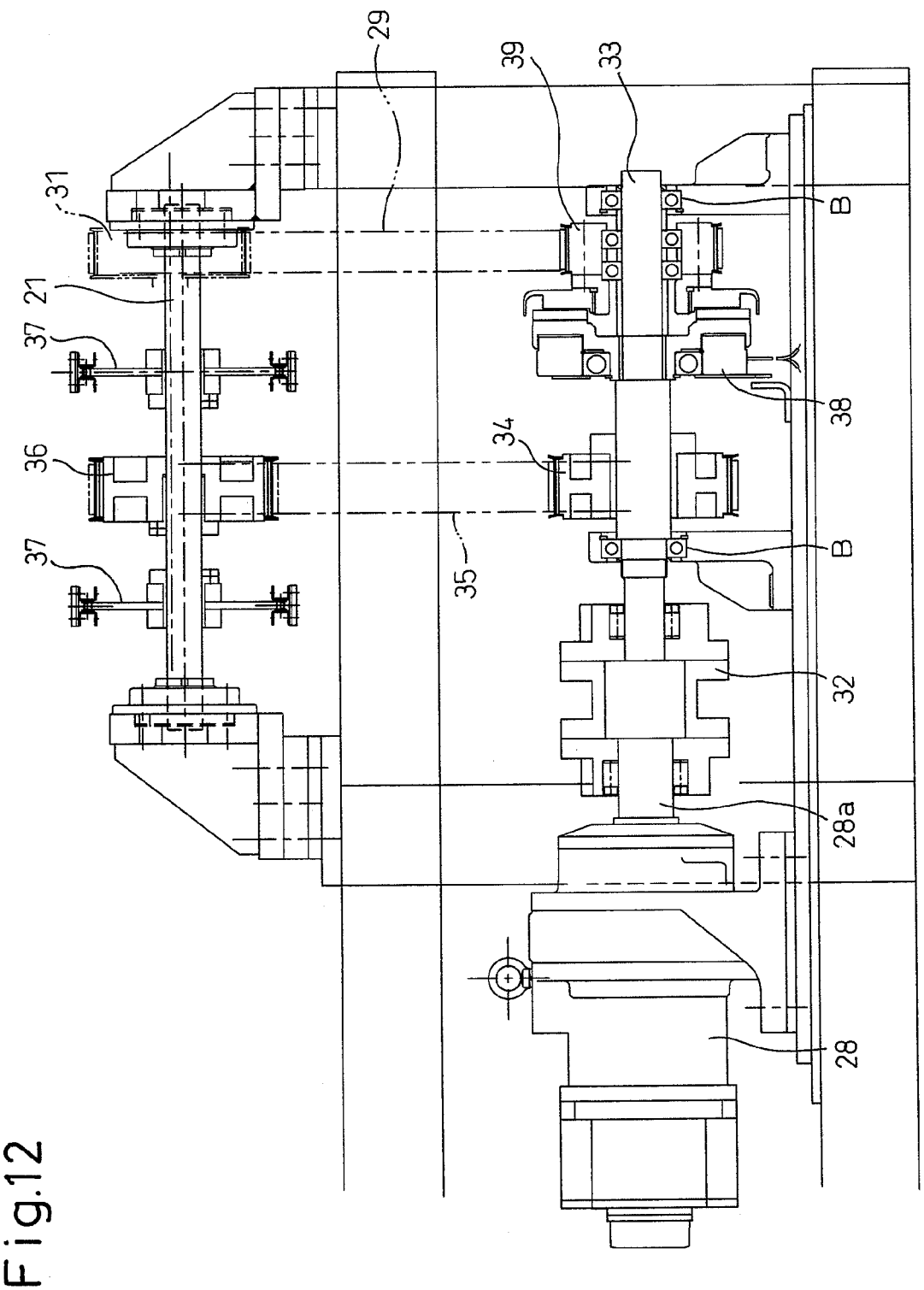
FIG. 12 is a view of the shared drive means and of a driving force transmission mechanism.

Referring to FIGS. 10 and 11, the transfer mechanism 4 includes connection conveyers 19 between the conveyers 5 with magnets and the belt conveyers 6 in the inspection line 3. The connection conveyers 19 include lift means 20 for separating apart the solar cells Sc overcoming the magnetic attractive forces of the conveyers 5 with magnets for the solar cells Sc of the solar cell module Sm that is sent from the conveyers 5 with magnets onto the inspection line 3.

The connection conveyers 19 are arranged in parallel with the conveyers 5 with magnets and the belt conveyers 6, and are arranged near the center between the pair of conveyers 5 with magnets in a direction at right angles with the direction of travel (direction of inspection line 3). On the other hand, the belt conveyers 6 are constituted by a pair of outer belt conveyers 6o positioned on both outer sides of the pair of conveyers 5 with magnets, and a pair of inner belt conveyers 6i arranged maintaining the same distance as the conveyers 5 with magnets.

The connection conveyers 19 span from a hand-over start end of belt pulleys 23 fixed to a first belt shaft 22 at a position entering more into the side of the assembly line 2 than a drive shaft 21 to which are fixed chain sprocket (described later) round which the conveyers 5 with magnets run over to a hand-over end of belt pulleys 25 fixed to a second belt shaft 24 at a position entering more into the side of the inspection line 3 than the drive shaft 21. Among the belt conveyers 6, further, the outer belt conveyers 6o run round the belt pulleys 26 fixed to the first belt shaft 22 at the position entering into the side of the assembly line 2, while the inner belt conveyers 6i run round the belt pulleys 27 fixed to the second belt shaft 24.

The connection conveyers 19 have a timing belt 29 that is spanning so as to be driven in synchronism by the drive means 28 shared by the conveyers 5 with magnets and the belt conveyers 6. That is, the timing belt 29 is spanning between the timing pulley 30 fixed to the first belt shaft 22 round which the connection conveyers 19 run and the timing pulley 31 fixed to the second belt shaft 24. As the shared drive means 28, a geared servo motor 28 is used (see FIG. 10).

The driving force of the geared servo motor 28 is transmitted from a timing pulley 34 fixed to a motor shaft 33 that is coupled to an output shaft 28a via a coupling 32 and is rotatably supported at its both ends by bearings B to a timing pulley 36 and to chain sprockets 37 fixed to a drive shaft 21 that is rotatably supported at its both ends by bearings through a timing belt 35, to thereby drive the conveyers 5 with magnets.

Further, a timing pulley 39 is fixed to an electromagnetic clutch 38 fixed to the motor shaft 33, and the driving force of the geared servo motor 28 is transmitted to the timing pulley 31 fixed to the second belt shaft 24 through the timing belt 29 only when the electromagnetic clutch 38 is connected, to thereby drive the connection conveyers 19 and the belt conveyers 6.

In the above constitution, the chain conveyers 8 eliminate the slipping between the conveyers 5 with magnets and the pulleys, a servo motor is used as a shared drive source for the belt conveyers 6, the driving force is transmitted through the timing belt and timing pulley without backlash and, thus, a piece of solar cell Sc can be intermittently fed and positioned.

Figure 13:
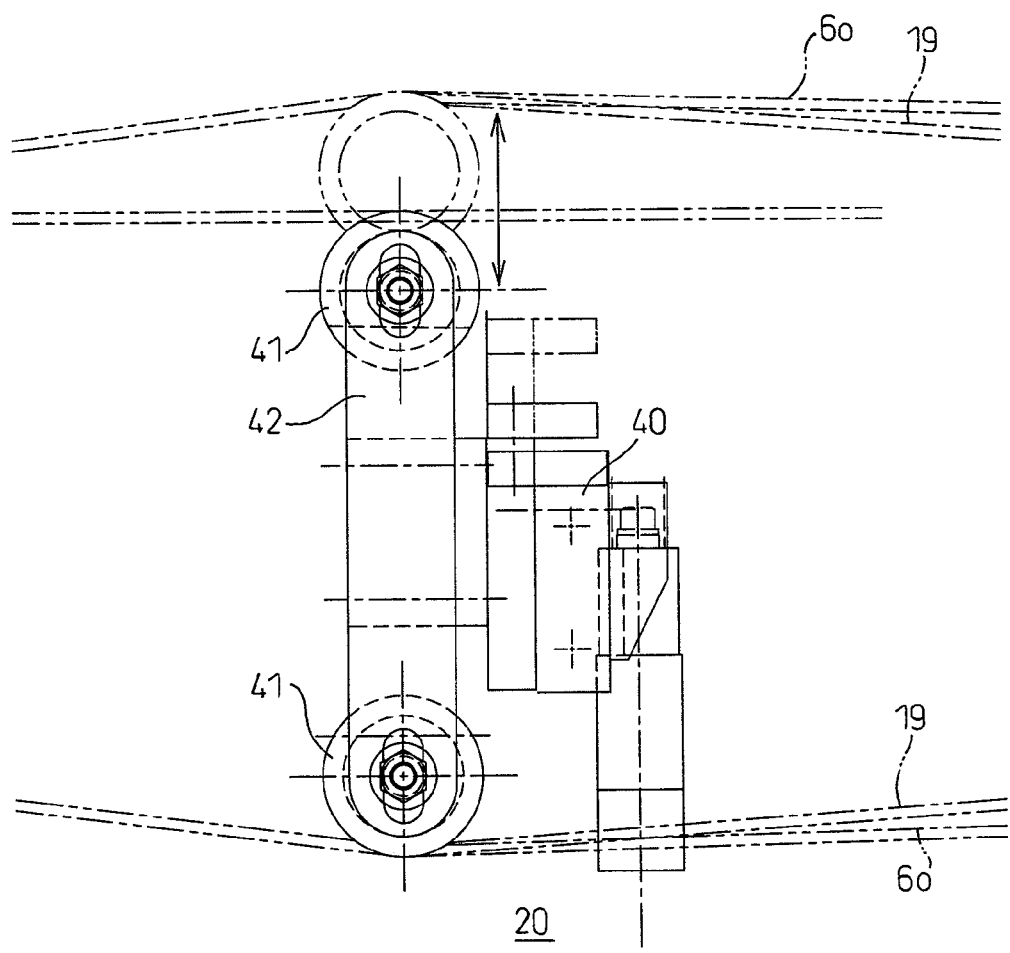
FIG. 13 is a side view of a lift means in the transfer mechanism.
Figure 14:
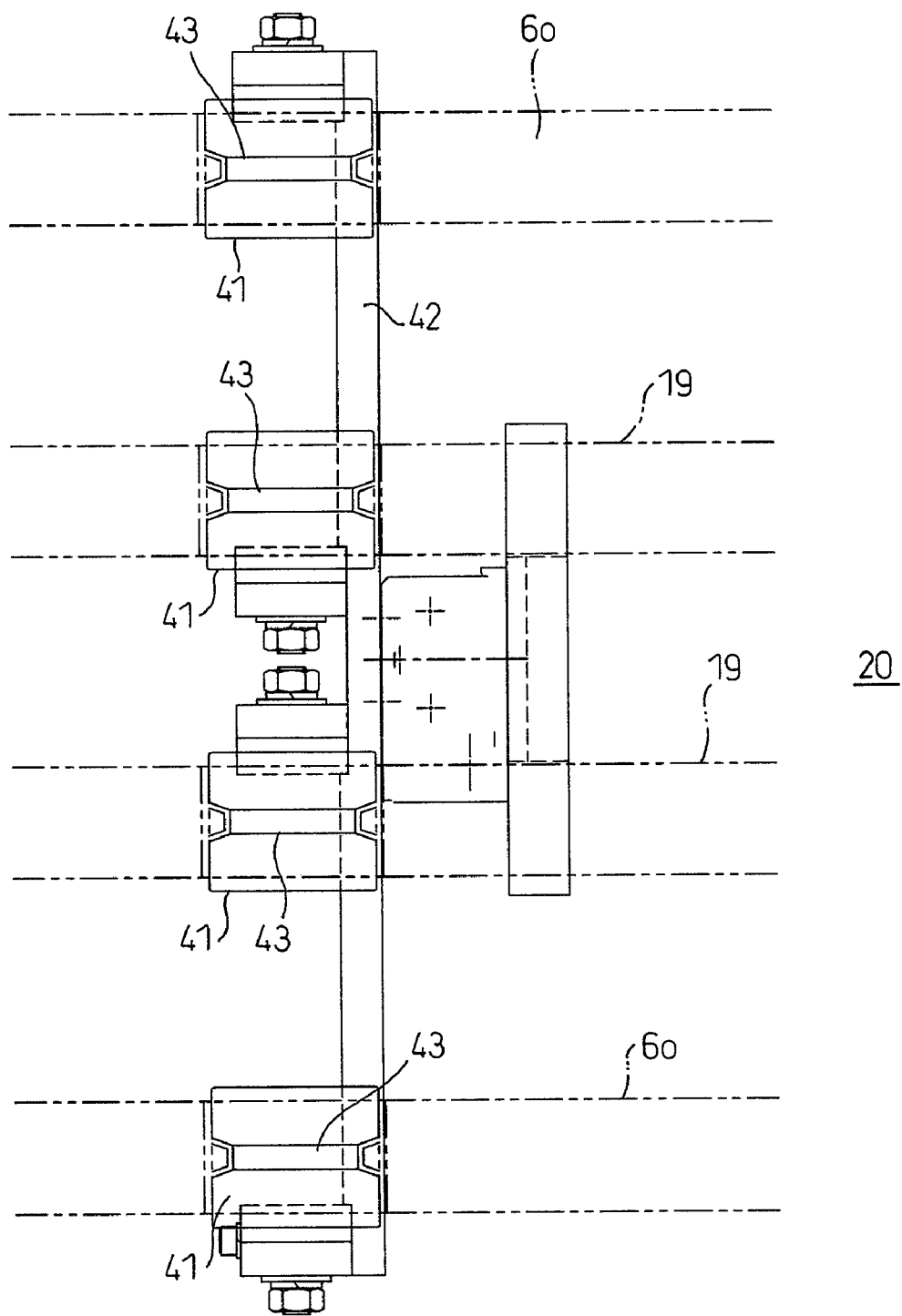
FIG. 14 is a plan view of the lift means shown FIG. 13.

Referring to FIGS. 13 and 14, a lift means 20 includes a cylinder 40 with guide which is a direct-acting means, and belt guide rollers 41 that are rotatably supported by bearings.

The lift means 20 is located between the drive shaft 21 and the first belt shaft 22, is supported by the cylinder 40 with guide via a support plate 42, and has four belt guide rollers 41 at the upper and lower positions each so as to come in contact with the outer belt conveyers 6o and the connection conveyers 19 from their back surface sides.

The lift means 20, further, has passage sensors (not shown) at portions upstream of the transfer mechanism 4 leading to the positions of the belt guide rollers 41 for detecting the passage of the terminal assembly Ta of the solar cell module Sm. That is, upon detecting the passage of the terminal assembly Ta by the passage sensors, the lift means 20 drives the cylinder 40 with guide to lift up the belt guide rollers 41.

The outer belt conveyers 6o and the connection conveyers 19 have guide protuberances on the traveling surfaces thereof that come in contact with the belt guide rollers 41 along the center axes in the lengthwise direction. The guide protuberances 6p and 19p fit to guide grooves 43 formed in the belt guide rollers 41 along the outer circumference thereof in the direction of rotation, preventing the outer belt conveyers 6o and the connection conveyers 19 from running off the belt guide rollers 41.

When the solar cell module Sm attractively held by the conveyers 5 with magnets is transferred onto the belt conveyers 6 in the inspection line 3, the belt guide rollers 41, 41 rotatably supported by the cylinder 40 with guide via bearings are elevated to lift up the connection conveyers 19 and the outer belt conveyers 6o which are part of the inspection line 3, whereby the solar cell module Sm attractively held by the conveyers 5 with magnets is removed from the conveyers 5 with magnets in a state where the attractive force based on the magnetic force is weakened, and is transferred onto the belt conveyers 6 in the inspection line 3 via the connection conveyers 19 without being caught.

Figure 15:
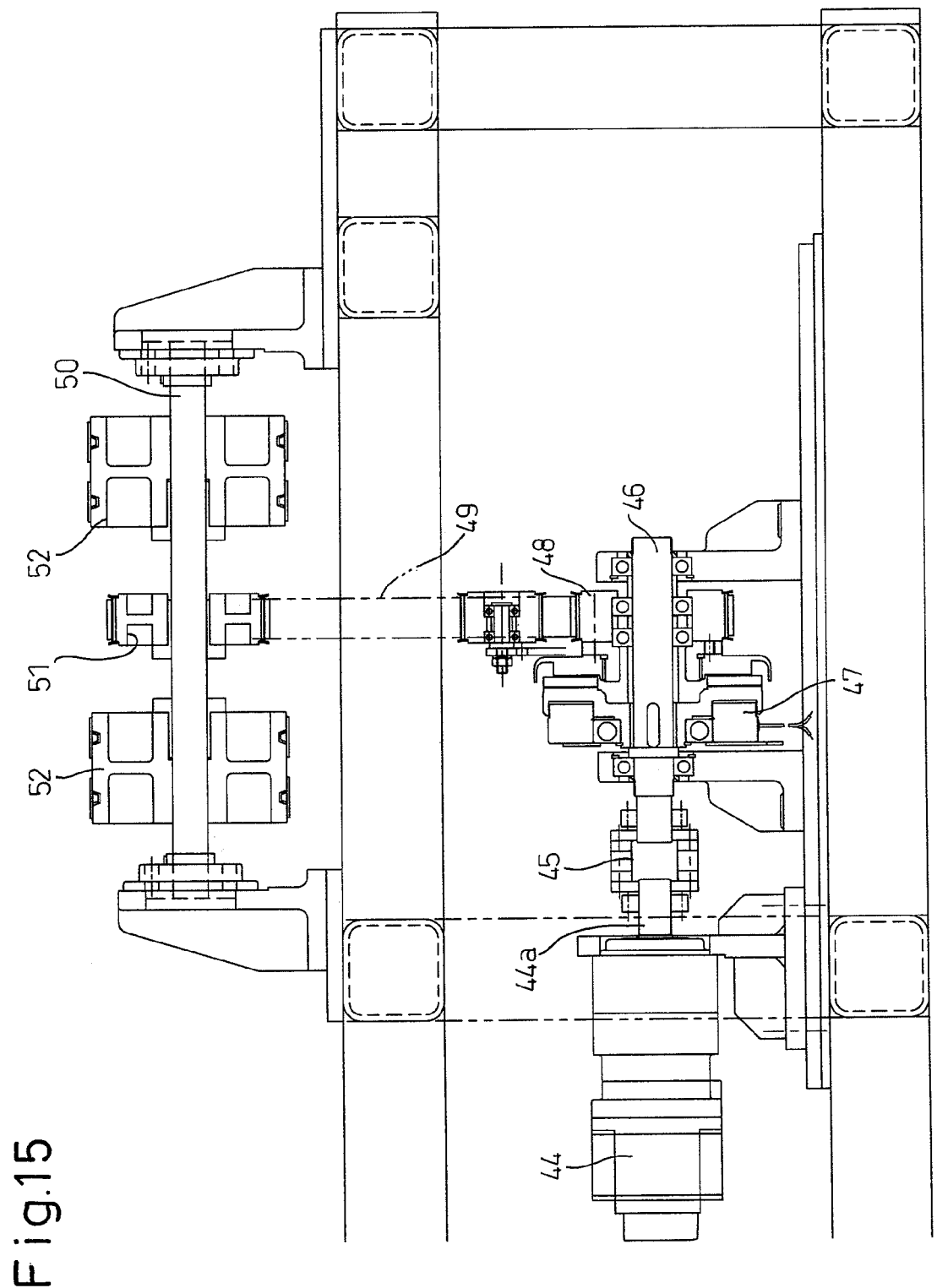
FIG. 15 is a view of a drive means dedicated to the inspection line and a driving force transmission mechanism.
Figure 16:
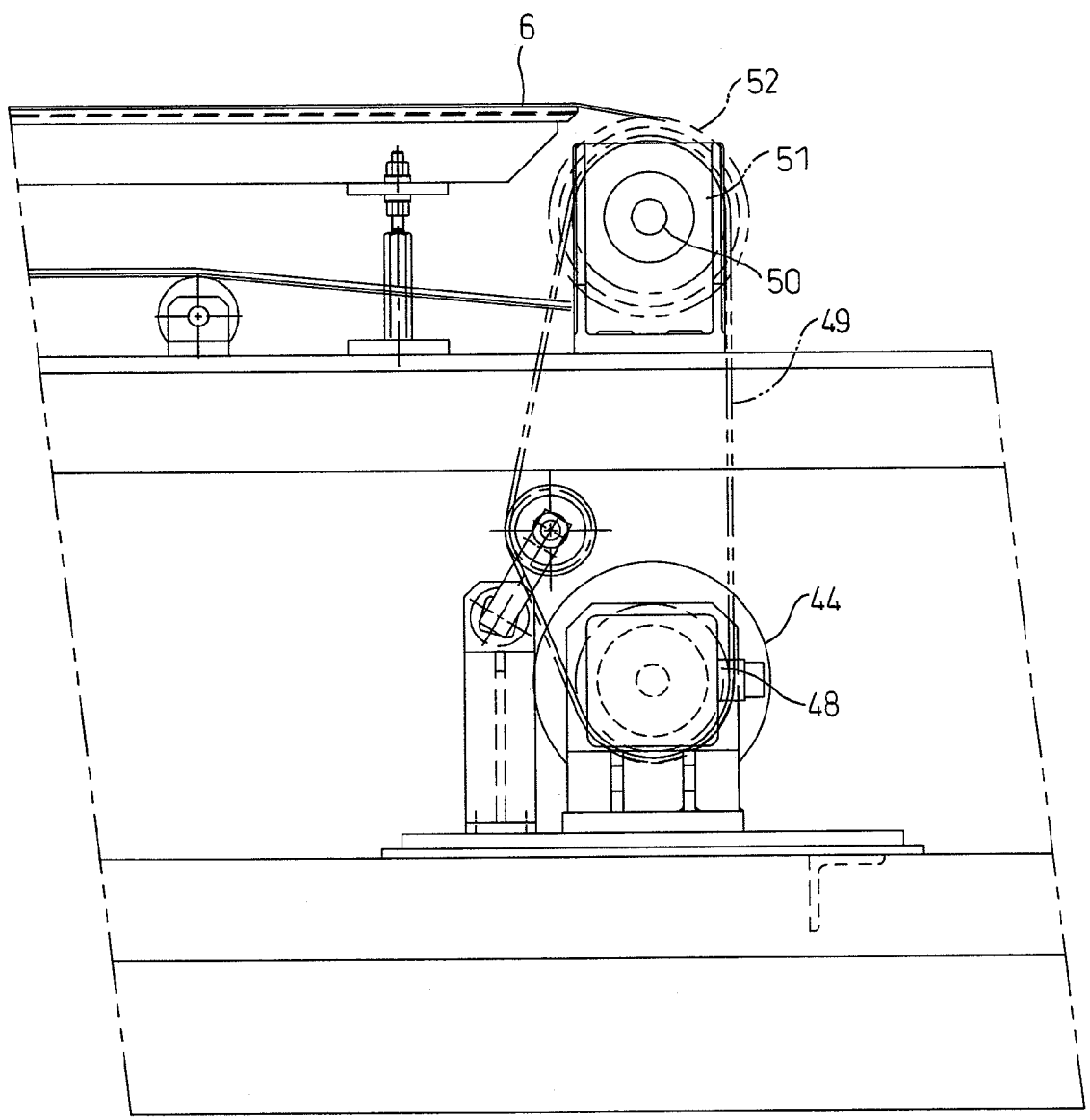
FIG. 16 is another side view of the drive means and the driving force transmission mechanism shown in FIG. 15.

The inspection line 3, further, includes a dedicated geared servo motor 44 on the terminal side in addition to the geared servo motor 28 which is the shared drive means (see FIGS. 15 and 16).

An output shaft 44a of the dedicated geared servo motor 44 is connected, via a coupling 45, to a motor shaft 46 which is rotatably supported at its both ends by bearings. An electromagnetic clutch 47 is fitted to the motor shaft 46, and a timing pulley 48 is fixed to the electromagnetic clutch 47.

Only when the electromagnetic clutch 47 is connected, the driving force of the geared servo motor 44 is transmitted to a timing pulley 51 and to a belt pulley 52 fixed to a drive shaft 50 through a timing belt 49, to thereby drive the inspection line 3.

Upon disconnecting the electromagnetic clutch 38 on the side of the geared servo motor 28 which is the shared drive means, connecting the electromagnetic clutch 47 dedicated to the inspection line 3 and driving the inspection line 3 by using the dedicated geared servo motor 44, it is allowed to convey the solar cell module Sm at a relatively high speed on the inspection line 3 separately from the assembling steps on the conveyers 5 with magnets.

The solar cell module conveyer line according to the invention is constituted as described above. Next, described below are a series of steps of assembling, conveyance, inspection and transfer. Described below is an example of the solar cell module Sm comprising many pieces of solar cells Sc and the terminal assembly Ta as shown in FIG. 3. To execute a series of steps, the conveyer line 1 is intermittently conveyed by a predetermined distance (by the length of the solar cell Sc) by a controller (not shown) every time and is positioned to feed the solar cell module Sm (see FIG. 1).

In the working/treating step which is a step of assembling, the solar cells Sc for constituting the solar cell module Sm are successively and intermittently fed for every distance equal to the length of a piece of solar cell Sc, and are subjected to various workings on the assembly line 2 by using machinery arranged along the conveyers 5 with magnets in the assembly line 2 to fabricate the solar cell module Sm.

Upon driving the geared servo motor 28 which is the drive means and is also shared by the belt conveyers 6 in the inspection line 3, the driving force is transmitted to the chain sprocket 37 fixed to the drive shaft 21 which is rotatably supported at its both ends by bearings through the motor shaft 33 coupled to the output shaft 28a via the coupling 32, through the timing pulley 34 fixed to the motor shaft 33 and through the timing belt 35, and the conveyers 5 with magnets are driven in the assembly line 2.

In the automatic tension-adjusting mechanism 11 disposed near the position where the first step is executed, the tension-imparting sprockets 14 between the upper and lower idle sprockets 13 round which the conveyers 5 with magnets run are caused to push the chain conveyers 8 of the conveyers 5 with magnets so as to be in mesh therewith; i.e., the tension-imparting sprockets 14 are moved back and forth along the LM guides 18 extending in the axial direction of the conveyer frame 12, i.e., moved toward the end of the rod portions 17b of the air cylinders 17 together with the cylinder portions 17a of the air cylinders 17 by controlling the air pressure in the air cylinders 17 mounted in a directly acting manner on the direct-acting guide members 16 mounted on the inner frame 15 between the idle sprockets 13. Thus, the tension imparted to the conveyers 5 with magnets is adjusted (see FIGS. 4 and 9).

Therefore, the tension of the conveyers 5 with magnets is suitably adjusted at all times, and a predetermined intermittent drive is attained.

The solar cells Sc forming a photosensitive semiconductor film, using the SUS plates as substrates and having many collector wires stuck thereto in parallel as obtained in the preceding step are fed onto the conveyers 5 with magnets of the assembly line 2 by other conveyer means. Thereafter, the solar cells Sc for constituting the solar cell module Sm are successively and intermittently fed by a distance equal to the length of a piece of solar cell Sc and are each subjected to the treating steps on the conveyers 5 with magnets by using machinery arranged along the conveyers 5 with magnets in the assembly line 2.

Upon soldering side copper tabs is of the solar cells Sc, the solar cells Sc are electrically connected together maintaining a predetermined gap g.

To check the conduction in the final step, light is projected to the solar cell Sc from an exposure inspection device arranged under the conveyers 5 with magnets to check if a predetermined electric power is generated.

After the step of assembling the solar cells Sc is completed as described above, the conveyers 5 with magnets in the assembly line 2 and the belt conveyers 6 in the inspection line 3 are intermittently driven in synchronism by the geared servo motor 28 which is the shared drive means until the leading solar cell Sc arrives at a predetermined position.

Thus, all of the solar cells Sc constituting the solar cell module Sm are transferred from the conveyers 5 with magnets in the assembly line 2 onto the belt conveyers 6 in the inspection line 3.

After having finished the conduction checking in the final step, the leading solar cell Sc arrives at the connection conveyers 19 arranged between the conveyers 5 with magnets and the belt conveyers 6 in the inspection line 3.

The connection conveyers 19 are on the insides of the pair of conveyers 5 with magnets, run round the belt pulleys 23 fixed to the first belt shaft 22 at a position entering more into the side of the assembly line 2 than the chain sprockets 37 round which the conveyers 5 with magnets run. On both outer sides of the pair of conveyers 5 with magnets, further, the pair of outer belt conveyers 6o is running in parallel with the connection conveyers 19. When passing over these regions, therefore, the solar cells Sc are not caught by the magnetic force of the conveyers 5 with magnets, i.e., are not caught by the conveyers 5 with magnets, but are allowed to be smoothly transferred from the conveyers 5 with magnets in the assembly line 2 onto the inspection line 3 maintaining the initial intermittent motion and maintaining the gap g among the solar cells Sc.

When the leading solar cell Sc arrives at a predetermined position of the belt conveyers 6 in the inspection line 3 and the terminal assembly Ta at the end of the solar cell module Sm is detected by the passage sensor in front of the lift means 20 which is the transfer mechanism 4, the cylinders 40 with guide are driven.

Therefore, the belt guide rollers 41, 41 are elevated by about 30 mm (see FIG. 13) to lift up the connection conveyers 19 and the outer belt conveyers 6o which are part of the inspection line 3, the solar cell Sc neighboring the terminal assembly Ta receives a weakened magnetic force and can be transferred onto the belt conveyers 6. A decrease in the magnetic force to the solar cells Sc results in a decrease in the tensile force given to the side copper tabs is connecting the solar cells Sc and, therefore, a predetermined gap g is maintained among the solar cells Sc.

The electromagnetic clutch 38 on the side of the geared servo motor 28 which is the shared drive means is disengaged simultaneously with the completion of transfer of the terminal assembly Ta at the end of the solar cell module Sm, and the electromagnetic clutch 47 of the geared servo motor 44 dedicated to the inspection line 3 is connected to transmit the driving force of the dedicated geared servo motor 44 to the timing pulley 51 and to the belt pulley 52 fixed to the drive shaft 50 through the timing belt 49. Therefore, the belt conveyers 6 in the inspection line 3 are driven, and the leading solar cell module Sm is fed at a high speed to a predetermined position of the inspection line 3 and is halted in position.

While the solar cell module Sm is conveyed at a high speed on the belt conveyers 6 in the inspection line 3 by the dedicated geared servo motor 44, the steps for assembling the next solar cell module Sm is continued on the assembly line 2.

Next, the solar cell module Sm halting at a predetermined position on the inspection line 3 is attracted by the attractive conveyer devices 7 that are energized on the belt conveyers 6. At a moment when the solar cell module Sm is lifted up over the belt conveyers 6, the electromagnetic clutch 47 of the geared servo motor 44 dedicated to the inspection line 3 is disconnected, and the electromagnetic clutch 38 is connected on the side of the geared servo motor 28 which is the shared drive means to drive the conveyers 5 with magnets, connection conveyers 19 and belt conveyers 6 in synchronism.

The solar cell module Sm attracted and lifted up by the attractive conveyer devices 7 is transferred into an inspection space Ca by the side of the belt conveyers 6 and where the solar cell module Sm is inspected for its electromotive force and appearance.

Next, the solar cell module Sm is inverted (back side front) and is contained in a buffer to end a series of inspection steps.

In the foregoing were described the steps of assembling and inspecting the solar cell module Sm constituted by connecting several tens of solar cells Sc and the terminal assembly Ta along the solar cell module conveyer line 1 of the invention. It should, however, be noted that several pieces to several tens of pieces thereof can similarly be assembled and inspected, as a matter of course.

The present invention makes it possible to provide a solar cell module conveyer line free of such problems (1) that the conveyer belts with magnets lack durability, (2) that the production line must be halted while the whole conveyer belts are to be replaced for replacing magnets, (3) that it is difficult to maintain a predetermined gap among the solar cells due to a slight degree of slipping between the pulleys and the steel belts of conveyer belts with magnets, and (4) that the products are often damaged when being transferred from the conveyer belts with magnets to the next belt conveyers. Thus, the solar cell module conveyer line of the invention makes it possible to intermittently convey and position a plurality of solar cells successively for every predetermined distance (length of the solar cell), and to inspect and take out the products.

DESCRIPTION OF REFERENCE NUMERALS

1—solar cell module conveyer line
2—assembly line
3—inspection line
4—transfer mechanism
5—conveyers with magnets
6—belt conveyers
6o—outer belt conveyers
6i—inner belt conveyers
6p—guide protuberances
7—attractive conveyer device
8—chain conveyers
8o—outer links
8i—inner links
9—magnets
10—plates
11—automatic tension-adjusting mechanism
12—conveyer frame
13—idle sprockets
14—tension-imparting sprockets
15—inner frames
16—direct-acting guide base bodies
17—air cylinders
17a—cylinder portions
17b—rod portions
18—LM guides
19—connection conveyers
19p—guide protuberances
20—lift means
21—drive shaft
22—second driven shaft
23, 25, 26, 27, 52—belt pulleys
24—third driven shaft
28, 44—geared servo motors
28a, 44a—output shafts
29, 35, 49—timing belts
30, 31, 34, 36, 39, 48, 51—timing pulleys
32, 45—couplings
33, 46—drive shafts
37—chain sprocket
38, 47—electromagnetic clutches
40—cylinders with guide
41—belt guide rollers
42—support plate
43—guide grooves
50—driven shaft
Sm—solar cell module
Sc—solar cells
Ca—inspection space
ts—side copper tabs
Ta—terminal assembly
g—gap

The invention claimed is:

1. A solar cell module conveyer line comprising:
an assembly line for intermittently feeding solar cells that constitute a solar cell module, and having machinery arranged for successively executing working/treating steps in order to assemble a solar cell module by connecting a plurality of pieces of solar cells maintaining a predetermined gap among the cells, wherein the assembly line includes conveyers with magnets;

an inspection line which is synchronized with said assembly line to inspect the solar cell module fabricated on the assembly line through the working/treating steps, wherein the inspection line includes belt conveyers; and a transfer mechanism for transferring said solar cell module from said assembly line onto said inspection line, wherein said transfer mechanism includes connection conveyers arranged in parallel with and between the conveyers with magnets of the assembly line and the belt conveyers of the inspection line, and lift means under the connection conveyers to shut off the magnetic attractive forces of said conveyers with magnets for the solar cell module that is to be fed from said conveyers with magnets onto said belt conveyers.

2. The solar cell module conveyer line according to claim 1, wherein the conveyers with magnets include chain conveyers which are traveling base bodies and magnets individually and detachably attached to endless chain-constituting elements of the chain conveyers.

3. The solar cell module conveyer line according to claim 2, wherein said conveyers with magnets are provided with an automatic tension-adjusting mechanism.

4. The solar cell module conveyer line according to claim 1, wherein said conveyers with magnets and said belt conveyers share drive means, and said conveyers with magnets and the belt conveyers are driven by the drive means so as to intermittently position and convey the solar cells for every predetermined distance.

5. The solar cell module conveyer line according to claim 1, wherein said connection conveyers are driven by drive means shared by said conveyers with magnets and said belt conveyers.

6. The solar cell module conveyer line according to claim 1, wherein the belt conveyers of the inspection line have a hand-over start position which has entered more into the side of said assembly line than a hand-over end position of the conveyers with magnets of the assembly line, and said connection conveyers are arranged from the hand-over start position of the belt conveyers of the inspection line up to the hand-over end position which has entered more into said inspection line than the hand-over end position of said conveyers with magnets.

7. The solar cell module conveyer line according to claim 4, wherein the belt conveyers of the inspection line include dedicated drive means in addition to said shared drive means, and said belt conveyers are driven by switching the shared drive means and the dedicated drive means in order to convey the solar cell module.

8. The solar cell module conveyer line according to claim 1, wherein said conveyers with magnets are driven by transmitting the driving force to a timing pulley and a chain sprocket fixed to a drive shaft that is rotatably supported through a timing pulley fixed to a motor shaft in the drive means shared by said conveyers with magnets and the belt conveyers and through a timing belt, and only when said clutch is coupled, the connection conveyers and the belt conveyers are driven by transmitting the driving force of said shared drive means to the timing belt spanning from the hand-over start position of said connection conveyers and of the belt conveyers to the hand-over end position of the connection conveyers and to the timing pulley through a timing pulley fixed to the clutch provided on said motor shaft.

9. The solar cell module conveyer line according to claim 1, wherein said lift means has belt guide rollers that come in contact with said belt conveyers and the connection conveyers from the back surface sides thereof, and direct-acting drive means for driving the belt guide rollers up and down.

* * * * *